United States Patent
Jeng et al.

(10) Patent No.: US 9,488,057 B2
(45) Date of Patent: Nov. 8, 2016

(54) MICRO JET GAS FILM GENERATION APPARATUS

(71) Applicant: AERONAUTICAL SYSTEMS RESEARCH DIVISION NATIONAL CHUNG SHAN INSTITUTE OF SCIENCE AND TECHNOLOGY, Taoyuan County (TW)

(72) Inventors: Dun-Zen Jeng, Taichung (TW); Chao-Ching Wang, Taichung (TW); Ting-Hua Chien, Taichung (TW); Chi Kao, Taichung (TW)

(73) Assignee: AERONAUTICAL SYSTEMS RESEARCH DIVISION NATIONAL CHUNG SHAN INSTITUTE OF SCIENCE AND TECHNOLOGY, Taoyuan County (TW)

( * ) Notice: Subject to any disclaimer, the term of this patent is extended or adjusted under 35 U.S.C. 154(b) by 368 days.

(21) Appl. No.: 14/301,112

(22) Filed: Jun. 10, 2014

(65) Prior Publication Data

US 2015/0354368 A1    Dec. 10, 2015

(51) Int. Cl.
*F01D 5/18* (2006.01)
*F02C 7/18* (2006.01)
*H05K 7/20* (2006.01)
*F01D 25/14* (2006.01)

(52) U.S. Cl.
CPC ............... *F01D 5/186* (2013.01); *F02C 7/18* (2013.01); *F01D 25/14* (2013.01); *F05D 2260/202* (2013.01); *F05D 2260/204* (2013.01); *H05K 7/20* (2013.01); *Y02T 50/675* (2013.01)

(58) Field of Classification Search
CPC .......... F01D 5/18; F01D 5/186; F01D 5/187; F01D 5/046; F01D 25/12; F01D 25/14; F01D 2/288
See application file for complete search history.

(56) References Cited

U.S. PATENT DOCUMENTS

2015/0082808 A1*    3/2015    Crites ..................... F01D 5/186
                                                                  60/806

FOREIGN PATENT DOCUMENTS

TW            I257447 B      7/2006

\* cited by examiner

*Primary Examiner* — Jay Liddle
*Assistant Examiner* — Topaz L Elliott
(74) *Attorney, Agent, or Firm* — Muncy, Geissler, Olds & Lowe, P.C.

(57) ABSTRACT

A micro jet gas film generation apparatus aims to eject a gas to a work object which is desired for cooling or insulating from heat. The micro jet gas film generation apparatus has a spout formed at a diameter of 5-100 μm to generate a gas film on the work object. As the diameter of the spout of the micro jet gas film generation apparatus is small, the micro jet gas film generated from the spout cannot produce a large eddy due to the lack of sufficient energy, hence can maintain a thin film after a long distance ejection to improve cooling and heat insulation performance. Moreover, due to the small diameter of the spout, it also consumes less gas and can reduce the amount of gas required.

4 Claims, 4 Drawing Sheets

MICRO JET GAS FILM GENERATION APPARATUS

FIELD OF THE INVENTION

The present invention relates to a cooling and heat insulation structure and particularly to a micro jet gas film generation apparatus used for cooling and heat insulation.

BACKGROUND OF THE INVENTION

Modern high performance gas turbines have intake temperature proximate 2,000K. In order to protect the blades, forming a cooling gas film on the metal surface of the blades through cooling airflow generated by free jet is one of the most commonly used methods to reduce the thermal stress load of the gas turbine blades.

According to liquid state stability theory, a jet has an unstable state with a symmetrical eddy, which is generated by mixing natural jet with external air. As the shearing stress generated by velocity causes turbulence to grow exponentially toward downstream, after the most unstable fluctuation has grown to a certain degree, a nonlinear effect is generated and an eddy with a regular arrangement and specific frequency by rolling up is formed as shown in FIG. 1. As a result, a certain distance after ejection, the free jet is mixed with high temperature airflow, and gas film can no longer be formed continuously to protect the metal surface.

Taiwan patent No. I257447 entitled "Micro tube cooling used on distal ends of turbine blades" discloses an embedded micro tube in a streamline body. It can eject cooling air from inside of the streamline body to an external area thereof, and the embedded micro tube has a plurality of ejection spouts, hence can effectively perform cooling for the streamline body. However, the embedded micro tube is complex in design and must be built inside the streamline body, it is quite difficult in fabrication.

Moreover, cooling is a problem not only happened to the turbine blades. In order to achieve desired cooling effect, conventional chips have to add radiation fins to increase cooling area, and a bigger air fan often is needed to disperse heat quickly. However, as the chip is shrunk constantly, the cooling method that adopts the radiation fins and air fan can no longer meet cooling requirement.

SUMMARY OF THE INVENTION

The primary object of the present invention is to solve the problem of symmetrical eddy formed by gas film in the conventional techniques that results in an inability to insulate high temperature airflow and perform effective cooling.

Another object of the invention is to solve the cooling and heat insulation problems of turbine blades that occur to using the conventional techniques.

To achieve the foregoing objects, the present invention provides a micro jet gas film generation apparatus which is installed on a work object and includes at least one airflow passing hole running through the work object, an airflow veering member corresponding to the airflow passing hole and an airflow input member connected to the airflow passing hole. Furthermore, the airflow veering member is located on a surface of the work object and covers the airflow passing hole, and forms a gap against the work object to form a spout communicating with the airflow passing hole. The spout is formed at a diameter of 5-100 µm. The Reynolds number (Re) of the gas generated from the spout is smaller than 560, is defined as Re=$\rho$VD/$\mu$=VD/$\nu$; where V is an average gas flow rate of the gas generated by the spout, D is the diameter of the spout, $\mu$ is fluid dynamic viscosity, $\nu$ is kinematic viscosity, and $\rho$ is fluid density. The airflow input member is connected to one end of the airflow passing hole opposite to the airflow veering member to send a gas through the airflow passing hole and airflow veering member to the surface of the work object.

By means of the structure set forth above, the micro jet gas film generated by the invention cannot produce a large eddy due to the lack of sufficient energy, hence can maintain a thin film a long distance after ejection to improve cooling and heat insulation effect. In addition, the spout is formed at a smaller diameter and consumes less gas, thus it also can reduce the amount of gas needed. As a result, the invention can provide many advantages over the conventional techniques, such as simpler design, and easier installation and implementation.

The foregoing, as well as additional objects, features and advantages of the invention will be more readily apparent from the following detailed description, which proceeds with reference to the accompanying drawings.

DETAILED DESCRIPTION

DETAILED DESCRIPTION OF THE PREFERRED EMBODIMENT

Figure 1:
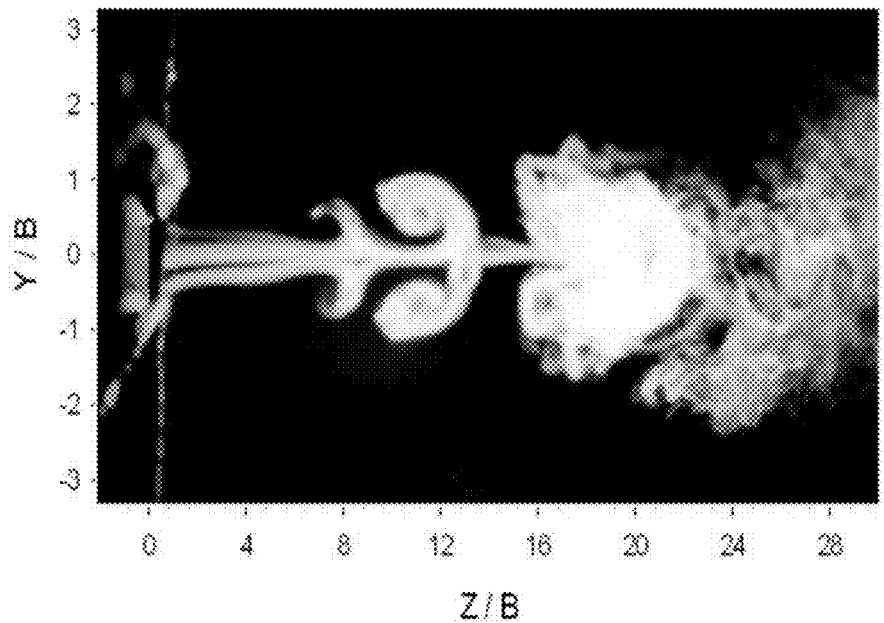
FIG. 1 is a schematic view of airflow ejection of conventional techniques.
Figure 2:
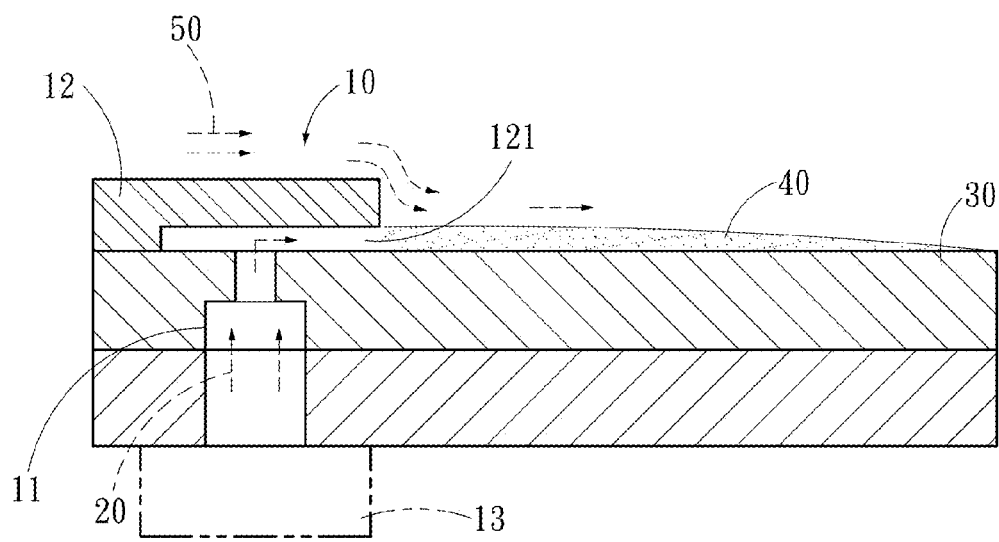
FIG. 2 is a sectional view of an embodiment of the invention.

Please refer to FIG. 2, the present invention aims to provide a micro jet gas film generation apparatus 10 which is fabricated through micro-electromechanical technology. The micro jet gas film generation apparatus 10 is located on a work object 30 and includes at least one airflow passing hole 11 running through the work object 30, an airflow veering member 12 corresponding to the airflow passing hole 11, and an airflow input member 13 connected to the airflow passing hole 11. The airflow veering member 12 is located on a surface of the work object 30, such as a turbine blade or aircraft wing, and covers the airflow passing hole 11, and forms a gap against the work object 30 to form a spout 121. The spout 121 communicates with the airflow passing hole 11 and is formed at a diameter of 5-100 µm. The Reynolds number (Re) of the gas generated from the spout 121 is smaller than 560, and is defined as Re=$\rho$VD/$\mu$=VD/$\nu$; where V is an average gas flow rate of the gas generated by the spout 121, D is the diameter of the spout 121, $\mu$ is fluid dynamic viscosity, $\nu$ is kinematic viscosity, and $\rho$ is fluid density. The airflow input member 13 is connected to one end of the airflow passing hole 11 opposite to the airflow veering member 12 to send a gas 20 through the airflow passing hole 11 and airflow veering member 12 to the surface of the work object 30. The spout 121 is located on and parallel with the surface of the work object 30, hence the gas 20 is ejected out in parallel with the spout 121 and forms a micro jet gas film 40 on the surface of the work object 30. It is to be noted that the Reynolds number mentioned above must be met so that the gas ejected out from the spout 121 does not form the eddy, otherwise the gas film cannot be formed.

Figure 3A:
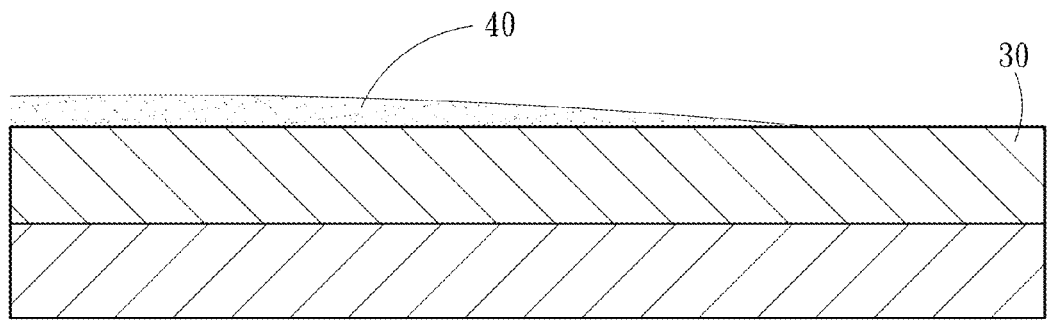
FIG. 3A is a schematic view of an embodiment of the invention in an ideal condition.
Figure 3B:
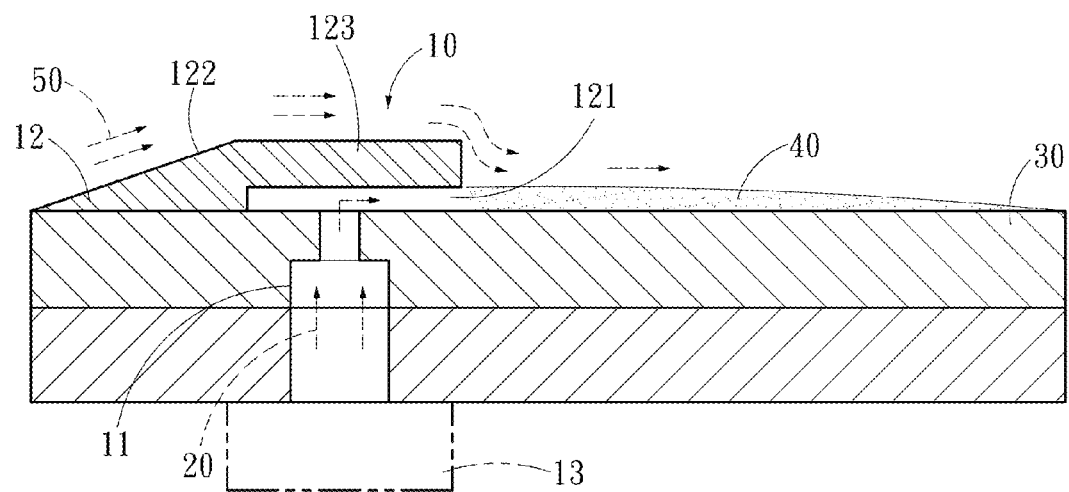
FIG. 3B is a schematic view of an embodiment of the invention in an actual use condition.
Figure 3C:
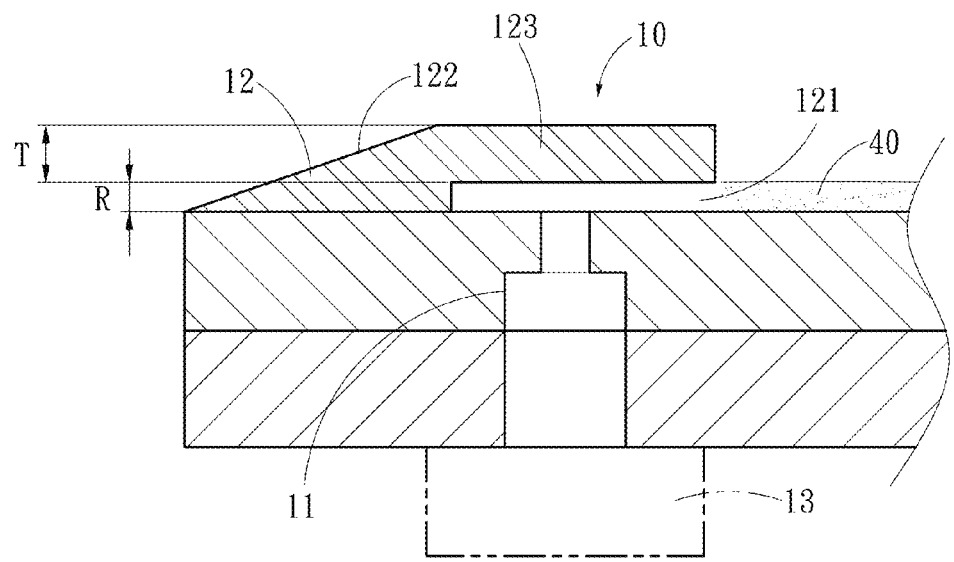
FIG. 3C is a fragmentary enlarged view of an embodiment of the invention.

In an ideal condition, please refer to FIG. 3A, the micro jet is directly ejected to the surface of the work object 30 to form the micro jet gas film 40. However, in practice, the micro jet gas film generation apparatus 10 has to be mounted onto the work object 30, as shown in FIG. 3B. When turbine blades spin, a thermal flow 50 passes through the airflow veering member 12 and flows to the work object 30. In this embodiment the work object 30 is a turbine blade, the airflow veering member 12 further has a thermal flow guiding surface 122 to reduce the resistance when the thermal flow 50 encounters the airflow veering member 12 so that the thermal flow 50 can flow smoothly forward. Aside from conforming to the conditions of Reynolds number smaller than 560 and the spout 121 formed at a diameter of 5-100 µm, also referring to FIG. 3C, a lid 123 of the airflow veering member 12 that is used for forming the spout 121 must meet the following condition: the thickness T of the lid 123 must be smaller than that of twofold height R of the spout 121. It also to be noted that the diameter of the spout 121 in this invention is the same as the height R. Hence when the thermal flow 50 passes over the airflow veering member 12, it encounters the micro jet gas film 40 which is ejected from the spout 121 and serves as a barrier between the thermal flow 50 and work object 30 to protect the work object 30. In addition, while the micro jet gas film 40 is ejected forwards, it also carries the thermal flow 50 away from the surface of the work object 30, hence also achieves cooling effect.

The micro jet gas film generation apparatus 10 can have a micro hole formed thereon by laser drilling at a diameter of 5-100 µm and connected to the airflow input member 13. Then the gas 20 can be ejected through the micro hole to form the micro jet gas film 40 as previously discussed.

Figure 4:
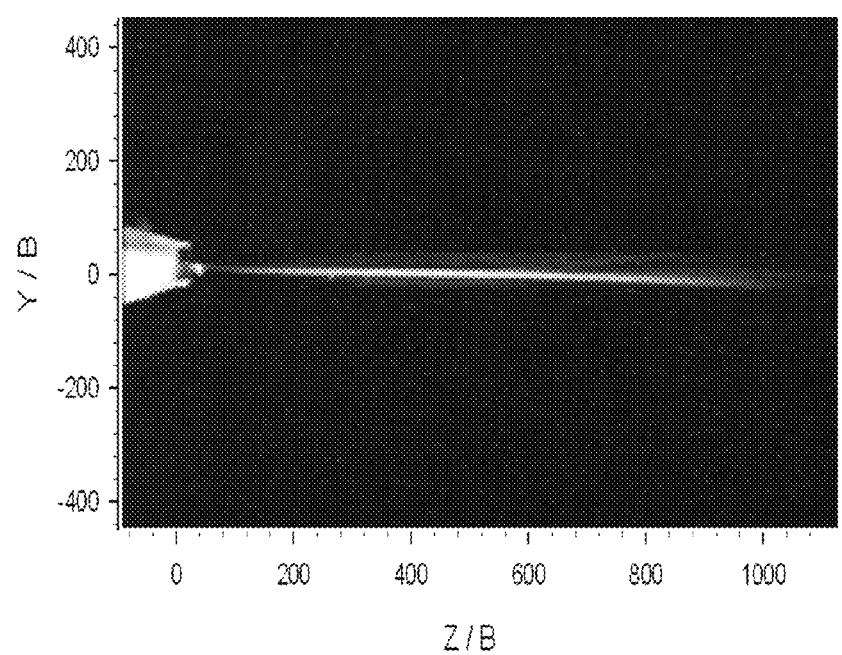
FIG. 4 is a schematic view of an embodiment of the invention in a micro jet ejecting condition.

Please refer to FIG. 4 for measurement results made via a hot-wire anemometer at different downstream locations about the central flow rate distribution, sideward flow rate distribution and turbulence intensity distribution. The micro jet generated by the spout 121 of the invention can maintain in a laminar flow structure along the downstream until it vanishes. Because the micro jet does not have enough energy to generate a large eddy structure, it does not produce symmetrical eddy that might otherwise mix with the thermal flow 50 as the conventional techniques do.

Figure 5:
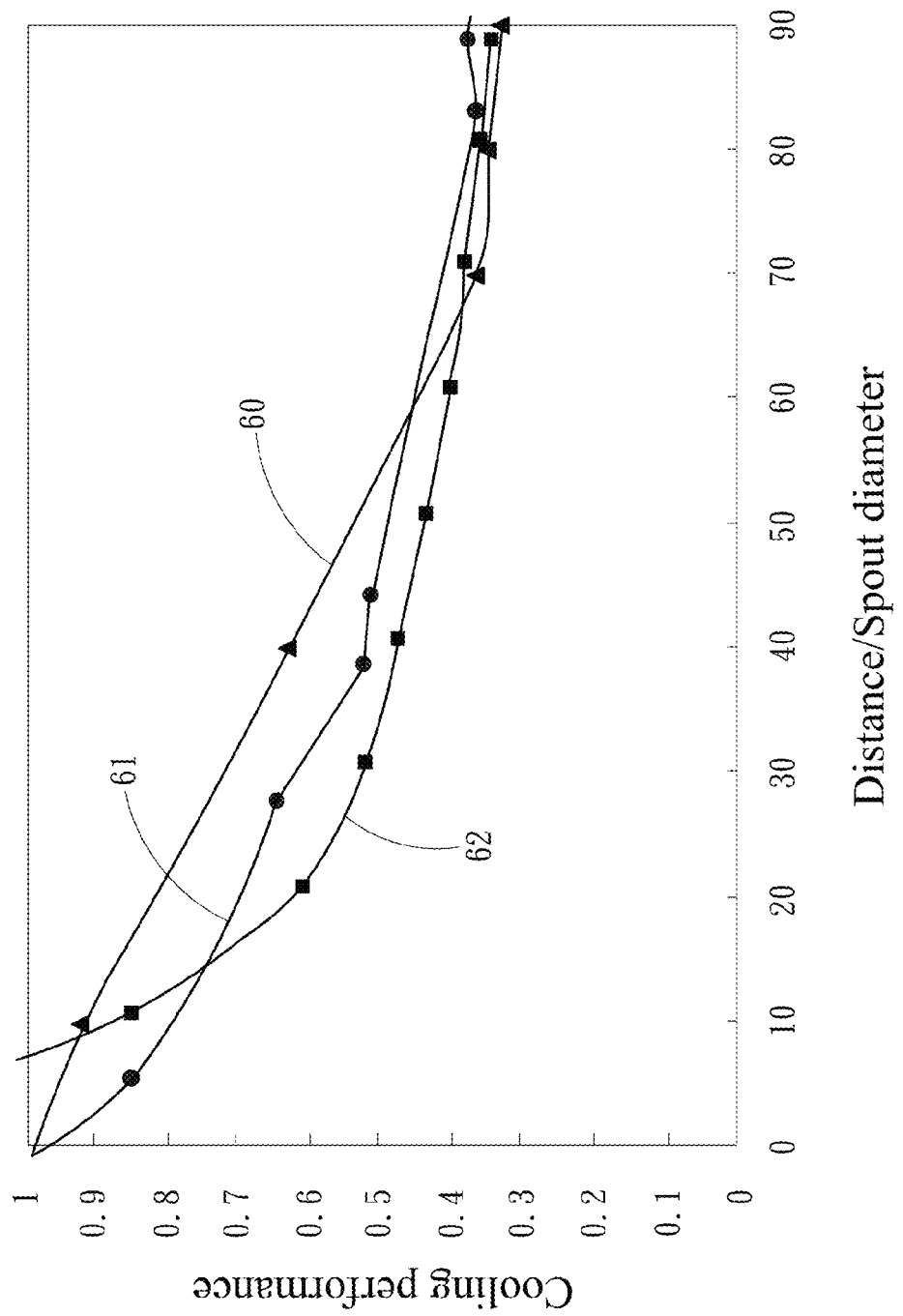
FIG. 5 is a chart showing cooling performance comparison between the invention and a conventional technique.

Please refer to FIG. 5 for comparison of the invention and a conventional technique in terms of cooling performance. Y axis indicates cooling performance, X axis indicates the ratio of distance to the diameter of the spout, and the technology published by Ko & Liu serves as the conventional technique. Given 1 for the flow amount coefficient, the cooling efficiency line 60 with the spout diameter of 25 µm and cooling efficiency line 61 with the spout diameter of 45 µm in the invention are both superior to the cooling efficiency line 62 of the conventional technique that decreases gradually with increase of the ejection distance. Moreover, the amount of cooling gas consumed by the micro jet of the invention is merely 1/100 to 1/1000 of that consumed in the conventional technique.

The micro jet gas film generation apparatus 10 of the invention can further be used on chips. As the chips generate heat and require external cooling apparatus, the micro jet of the invention can be directly ejected onto the chips or radiation fins connected to the chips to carry away the heat of the chips, hence it can achieve rapid cooling effect without the need to provide radiation fins with larger areas or air fans.

As a conclusion, a micro jet gas film 40 generated by the invention does not have adequate energy to generate a large eddy, hence can maintain a thin film a long distance after ejection to improve cooling and heat insulation. In addition, the spout 121 is formed at a smaller diameter and consumes less gas 20. It provides many advantages over the conventional techniques, such as simpler design, and easier installation and implementation. In addition, it can be used on chips that generate a great amount of heat. By ejecting the micro jet to the surface of the chips, the heat generated by the chips can be carried away rapidly.

What is claimed is:

1. A micro jet gas film generation apparatus, installed on a work object, comprising:
    at least one airflow passing hole running through the work object;
    an airflow veering member which is located on a surface of the work object and corresponds to and covers the airflow passing hole, and forms a gap against the work object to form a spout communicating with the airflow passing hole, the spout being formed at a diameter of 5-100 µm; and
    an airflow input member connected to one end of the airflow passing hole opposite to the airflow veering member to send a gas via the airflow passing hole and the airflow veering member to the surface of the work object;
    wherein Reynolds number (Re) of the gas generated from the spout is smaller than 560 that is defined as Re=$\rho$VD/$\mu$=VD/$\nu$; and wherein V is an average gas flow rate of the gas generated from the spout, D is the diameter of the spout, $\mu$ is fluid dynamic viscosity, $\nu$ is kinematic viscosity, and $\rho$ is fluid density.

2. The micro jet gas film generation apparatus of claim 1, wherein the work object is a turbine blade or an aircraft wing.

3. The micro jet gas film generation apparatus of claim 1, wherein the spout is located on and parallel with the surface of the work object.

4. The micro jet gas film generation apparatus of claim 3, wherein the airflow veering member includes a lid formed at a thickness smaller than that of twofold diameter of the spout.

* * * * *